(12) United States Patent
Zhang et al.

(10) Patent No.: US 9,183,331 B1
(45) Date of Patent: Nov. 10, 2015

(54) FORMALIZING IP DRIVER INTERFACE

(71) Applicant: Cadence Design Systems, Inc., San Jose, CA (US)

(72) Inventors: David Guoqing Zhang, Fremont, CA (US); Erik S. Panu, Los Gatos, CA (US); Levent Caglar, Dublin, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/231,136

(22) Filed: Mar. 31, 2014

(51) Int. Cl.
*G06F 17/50* (2006.01)

(52) U.S. Cl.
CPC .................. *G06F 17/5022* (2013.01)

(58) Field of Classification Search
CPC ............ G06F 17/5036; G06F 17/5022; G06F 17/5081; G06F 17/5045; G06F 17/5068; G06F 17/505

USPC ........................................ 716/106, 111, 136
See application file for complete search history.

(56) References Cited

U.S. PATENT DOCUMENTS

| 6,077,304 | A | 6/2000 | Kasuya | |
|---|---|---|---|---|
| 7,571,414 | B2 * | 8/2009 | Huang et al. | 716/138 |
| 7,904,878 | B2 | 3/2011 | Kolathur et al. | |
| 8,346,981 | B2 | 1/2013 | Scaffidi, Jr. | |
| 2007/0174638 | A1 * | 7/2007 | Fan et al. | 713/193 |
| 2008/0098339 | A1 | 4/2008 | Chan | |

* cited by examiner

*Primary Examiner* — Vuthe Siek
(74) *Attorney, Agent, or Firm* — Kenyon & Kenyon LLP

(57) ABSTRACT

A system and method that tests an IP component of a hardware design generates an abstract model of the IP component based on knowledge of the design and one or more protocols implemented with the IP component. A generic driver and associated interfaces are additionally generated or selected to test the IP component within the hardware design.

18 Claims, 5 Drawing Sheets

FIG. 1
100

| Test Bench 150 | | | |
|---|---|---|---|
| Driver Software Stack 135 | Customer Verification Codes 145 | | |
| Driver Interface 130 | Integration Interface 140 | HAL Interface 120 | |
| VIP 115 | Verification Interface 125 | | DIP 110 |
| Protocol Interface 105 | | | |

200

300

400

510

FORMALIZING IP DRIVER INTERFACE

BACKGROUND

Aspects of the present invention relate generally to the field of integrated circuit design, and in particular to techniques for verification and debug of such designs.

Hardware designers, for example integrated circuit (IC) designers, do not always design every component of a new hardware device. While designers may design one or more components of a particular device, they often employ component designs (also known as intellectual property, or design IP) from one or more third-party providers. Using components from third-party providers can facilitate the design by avoiding the need for the designer to design every aspect of the device's functionality. The design IP implemented in a device typically provide operations consistent with a standard protocol or with a proprietary protocol of the design IP provider.

Multiple aspects of a design typically may be tested. For example, a hardware design may undergo architectural simulation and analysis and debugging where the functionality of each component being implemented in the design is tested, for example, with transaction level modeling (TLM) or bus functional modeling. The hardware design may additionally undergo circuit simulation and analysis where the signals between components are tested, for example using register transition level (RTL) analysis. Other steps may include: design simulation, for example to model the components of a design together; design and software emulation, for example to model execution of software elements executing on a modeled design; FPGA prototyping; hardware and software co-verification; and post-silicon validation.

Each of these testing stages typically utilizes different verification platforms and/or different interface and driver tools, therefore limiting the reuse of verification methods, and tools relevant to verification. For example, hardware designers may employ a hardware based verification platform to perform certain tests on a completed design. Hardware verification platforms typically enable testing of the various components of the design which facilitates design analysis and debugging operations to identify and fix defects that are encountered. Such testing may require the creation of device specific drivers to verify that the inputs and outputs over a communication medium conform to a standard or predefined protocol. These drivers, sometimes referred to as firmware, are software stacks created to manage the design IP.

However, driver development is error-prone and time consuming. Conventionally, the drivers and tools necessary to test the design IP of a device are not implemented until after the design IP has been completed and further may require rewrites whenever a design IP is changed. Where the design IP is only a partial implementation of the protocol, the driver for the design IP will be incomplete. In such cases, the reuse of the driver for the next revision of the design IP becomes difficult. Because the driver is often developed based on the completion of the design IP, the testing process is significantly delayed because it is not parallelized with the design IP development. Additionally, the driver interface between an operating system and a device under test are often provided to the designer by the design IP developer in the context of a specific operating system information that is often proprietary, incomplete or ambiguous. As a result, the operating system and the driver may not function correctly together. Additionally, it is difficult to test the developed driver under all operating conditions of the design. For example, it is not possible to create all the relevant conditions during driver validation and many device protocol related conditions are not handled in the driver. Currently, testing of design IP is executed with a limited software stack. For example, the bare-metal driver sequences are developed to provide only limited testing from a software perspective. Once the particular test is complete, these sequences are typically discarded.

Accordingly, the art requires a system to efficiently test design IP, the design that contain the design IP, and the related drivers before the design under test is available.

BRIEF DESCRIPTION OF THE DRAWINGS

The foregoing and other aspects of various embodiments of the present invention will be apparent through examination of the following detailed description in conjunction with the accompanying drawing figures in which similar reference numbers are used to indicate functionally similar elements.

FIG. 1 illustrates an exemplary verification platform according to an embodiment of the present invention.

DETAILED DESCRIPTION

A system and method that tests a design IP component of a hardware design generates an abstract model of the design IP component based on knowledge of the design and one or more protocols implemented with the design IP component. A generic driver and associated interfaces are additionally generated or selected to test the design IP component within the hardware design. Generic drivers may be generated or provided for every potential protocol used in the hardware design, for every potential required interface, and for every operating system that may be used with the hardware design.

The model of the design IP component and the generic driver may be used to test the hardware and software functionality of the hardware design before the design IP component is available. When the design IP component hardware is available for incorporation with the designed hardware, switching the testing procedures from the design IP component model to the design IP component itself may be seamless, or may require only minimal driver and interface adjustments. Custom testcases and verification codes may be reused to test the protocols implemented within the hardware design and may be provided by the hardware designer, the application level designer, or the design IP component developer.

By defining and normalizing a driver interface for a design IP before the design IP implementation is complete, the testing process can be expedited, including parallelizing the development of the design verification environment and test sequences. Verification content generated during the creation of the design, including any potential object-oriented models, may be used to create the model of the design IP component and the generic driver. Verification concepts referenced in this application are described in more detail in U.S. patent application Ser. No. 13/929,277 filed on Jun. 27, 2013 and in U.S. patent application Ser. No. 13/964,846 filed on Aug. 12, 2013; these applications are incorporated by reference in this application in their entirety.

FIG. 1 illustrates an exemplary verification platform 100 according to an embodiment of the present invention. Verification platform 100 tests that a design for a hardware component or system on a chip (SOC) design conforms to the standards for one or more protocols implemented within the design. As shown in FIG. 1, the design under test contains at least one IP component, herein referred to as design IP (DIP) that may be a third party IP component.

As used herein the term design may refer to a system on a chip (SOC), a subsystem, or a system as created by a circuit designer. The term design under test refers to the design or portion of the design undergoing evaluation. The term design IP refers to a portion of the design provided by a third party.

Figure 2:
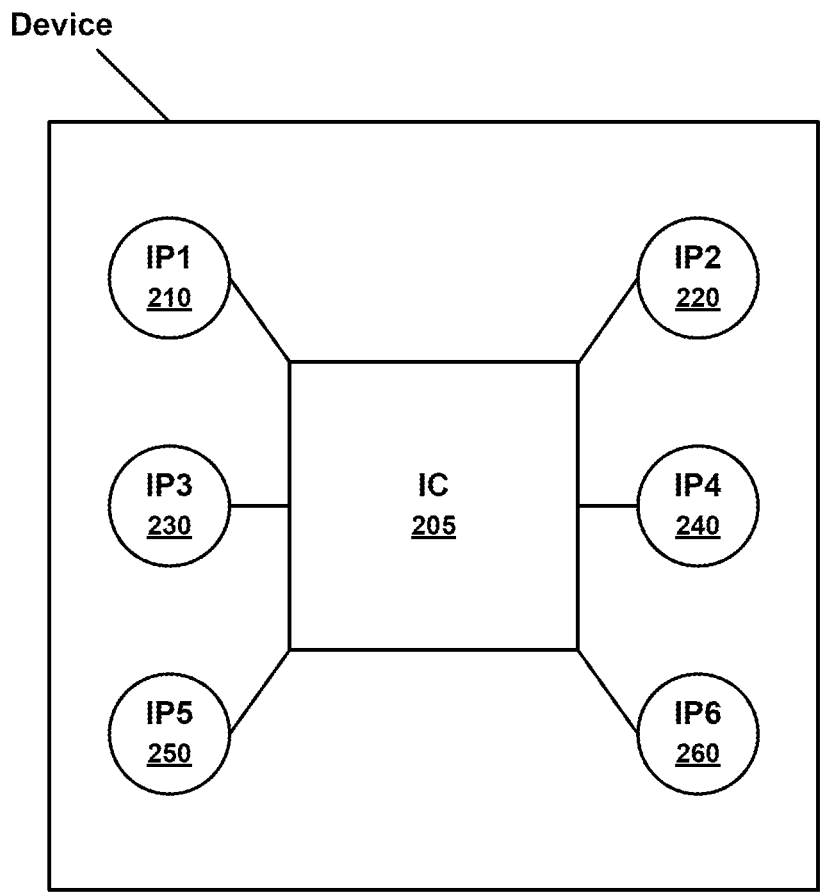
FIG. 2 is a simple block diagram illustrating an exemplary hardware design that may be tested with the verification platform according to an embodiment of the present invention.

FIG. 2 is a simple block diagram illustrating an exemplary hardware design 200 that may be tested with the verification platform 100 according to an embodiment of the present invention. The hardware design 200 may be a design for any hardware component or device, for example a mobile phone (including but not limited to a smartphone), a tablet, or a computer of some kind. The device includes one or more ICs 205 with design IP components IP1-IP6 210-260. For example a smartphone could include multiple design IP components such as memory (static or dynamic, general-purpose or special-purpose); graphics processing; audio; video; power management; various wired communication and/or bus protocols including but not limited to PCI Express, members of the PCI Express family, and/or variants thereof, in different applications depending on the data communications need; wireless communications protocols including but not limited to cellular (e.g. GSM/CDMA), Bluetooth™, Wi-Fi (some form of 802.11), WIMAX (some form of 802.16); various connection protocols including but not limited to different forms of USB (different versions, micro-USB, mini-USB, and the like), video connection protocols (e.g. Thunderbolt (which might be one example of a PCI Express application), HDMI, or others) or other connector types which may or may not be proprietary; and/or image processing (e.g. on-board camera functionality). All of these various elements could be provided in a single design (for example, in a system on a chip, or other design incorporating design IP from multiple providers, or multiple types of design IP from a single provider), or could be contained in multiple designs.

While some of the design IP components mentioned above may be proprietary, a number of them may be developed according to a standard, be it wired or wireless communications, audio, video, memory, or others. Different design IP providers can and will have different ways of implementing a particular standard. It should be noted that there may be portions of a standard for which compliance is mandatory, and other portions for which compliance is optional. The hardware designer may have a particular feature set in mind, in which compliance either with only mandatory portions of the standard, or with mandatory and certain optional portions of the standard, would be necessary.

Where a standard such as Bluetooth™, Wi-Fi, other communications, memory management, display, or other functionality in a device is implicated, verification of the design may include showing compliance with the standard. Where the functionality in question is the result of proprietary third party design IP which does not necessarily follow a particular standard, the design IP provider may disclose an interface definition or custom protocol, without the design IP provider revealing its proprietary information. The standards or provided definitions may then be utilized by the verification platform 100 to show that the components of the design execute properly or to otherwise identify errors.

In the case of design IP that is designed to provide particular functionality, but in accordance with a proprietary design or feature set rather than a standard, outputs of the design will be a proprietary function of the inputs. A design IP provider may be able to provide a custom protocol consisting of design-based sets of inputs and corresponding outputs, making it possible to exercise the design through a selection of various combinations of inputs without revealing proprietary aspects of the IP design component.

Returning to FIG. 1, a physical layer of a standard protocol interface 105, for example a PCIe Pipe connection, may be connected to either a design IP hardware 110 or a verification IP (VIP) model 115 that emulates the design IP hardware 110. When used with the design IP hardware 110, the verification platform 100 may connect the design IP 110 to an integration interface 140 via a hardware abstraction layer (HAL) interface 120. The integration interface 140 may simulate an operating system and operating system drivers that will communicate with the design IP hardware 110 via a standard protocol. Then, a testbench or other verification codes 145 may be implemented to run the design IP 110 through various testcases and scenarios. Conventionally, the integration interface 140 and HAL interface 120 are unique for each design IP 110 to be tested.

According to an exemplary embodiment, a verification IP model 115 may be provided that uses the verification and protocol knowledge developed and utilized during earlier design and verification phases of the device to execute a verification IP model that simulates an abstract version of the design IP 110. The VIP 115 may be connected to the integration interface 140 via a verification interface 125. As previously noted, the integration interface 140 may simulate an operating system and operating system drivers and therefore may be testcase or customer specific. However, according to an embodiment of the invention, the verification interface 125 will be standardized for the protocol being tested.

The verification and protocol knowledge of the VIP model 115 may include an object-oriented definition of one or more standards or other protocols implemented by the design. Objects for a protocol standard may be defined and utilized during any stage of the design verification process. For example, the object-oriented definition of the standard may be used during architectural development to confirm the component interconnections represented by associations between objects conform to the standard. Similarly, the object oriented definition of the standard may be used during component simulation, system emulation, debugging, or post-silicon analysis to confirm that the components of the design conform to the standard during execution. Additionally, the object oriented definition of the standard may be used to develop a verification driver and abstract VIP model of the design IP to test the design before the design IP is itself ready to undergo testing. Then the prior verification of the VIP model may be used to facilitate verification of the design IP.

As shown in FIG. 1, the VIP model 115 may additionally be connected to a driver interface 130 and an associated driver software stack 135. The driver interface 130 and associated driver stack 135 create a generic software driver for the protocol implemented with the protocol interface 105. The generic VIP driver sets out constraints for the design under test to ensure conformance to a protocol. A generic driver interface 130 may be developed for every protocol covered by the VIP of the design and for every testcase. A VIP driver may also be generated for each potential operating system in which the design IP 110 may operate, for example, for a Linux™, Windows™, iOS™, or Android™ operating system. According to an embodiment, for each particular instance of the VIP being tested, a VIP driver will be automatically generated. This allows for a highly configurable driver as any generated driver will be based on a unique combination of the design IP specification class for the implemented protocol, the specification version, and the operating system.

The driver interface 130 may include abstractions for data management, interrupt management, performance monitoring, status monitoring, error handling, service requests, configuration, power management, etc. The driver software stack 135 interfaces between an application simulated by the testbench 150 and the driver interface 130. According to an embodiment, the driver interface 130 may be exposed to the driver software stack 135 as DIP wrappers.

The customer verification codes 145 may include verification sequences and testcases that will execute on top of the driver software stack 135 and driver interface 130 to test the generic driver and the VIP model 115. The test bench 150 may be implemented to instantiate the software driver and the VIP model 115 and connects the driver to the test sequences 145. The customer verification codes and test sequences 145 may include a set of debug and verification testcases that are provided by the design IP developer or the designer to verify the design IP under test.

The driver interface 130 may use standardized interface commands to work with the verification IP model 115 such that various design IP 110 designs that conform to the standardized interface may be tested with the same interface. Utilizing the normalized, generated driver, the integration interface 140 can map the design IP specific driver to the generated driver interface 130. This simplifies the integration of the design IP into the design under test as the driver interface 130 will be consistent with the VIP model 115. The execution and test of the VIP driver should run seamlessly when the VIP model 115 is replaced by the design IP 110.

A designer may initially use the verification IP model 115 with the generated driver and a comprehensive test-suite. Once the design IP is available, the verification IP is replaced with the design IP hardware. For design IP components that have implemented an interface compatible with the verification interface 125, the hardware driver and test-suite should run with the design IP in the same manner as the test-suite was executed with the verification IP. Otherwise, the designer may map the verification IP driver stack to their design IP in order to get the proper execution results. Then, using the same driver, the designer can validate the design, including the design IP. Once the test-suite executes successfully, verification of the design IP is effectively complete.

By automatically generating a driver for the design IP, the designer benefits by receiving high quality and robust device drivers and driver stacks for each protocol and interface. The VIP centric driver stack and test-suite also ensure comprehensive and quick verification of the corresponding design IP which results in faster time to market.

Because the VIP information works with a variety of design IPs provided by a multitude of different IP developers, the generated VIP driver will be highly configurable for designs that undergo verification with the verification platform 100 and the verification platform 100 will model protocol details accurately before the design IP hardware is made available for testing.

The software development team may use the same generated VIP driver during software verification and test. This allows for earlier test and verification of software with the design IP and provides that whatever is done in either hardware or software conforms to the standards of the protocols being implemented. Reuse of the verification driver across verification services will aid in ensuring that the design IP works as expected and reduce the development time by avoiding creation of a relevant driver at each verification stage. Additionally, because the VIP driver will be available in advance of the design IP hardware, software developers can test various software and operating systems on exemplary hardware design models, for example, to test the inputs and outputs for communication via a known protocol, before the design IP hardware is available.

The verification platform may allow for backward compatible testing such that a designer can test older versions of the design IP, or otherwise turn off new features of the design IP and related driver(s).

Figure 3:
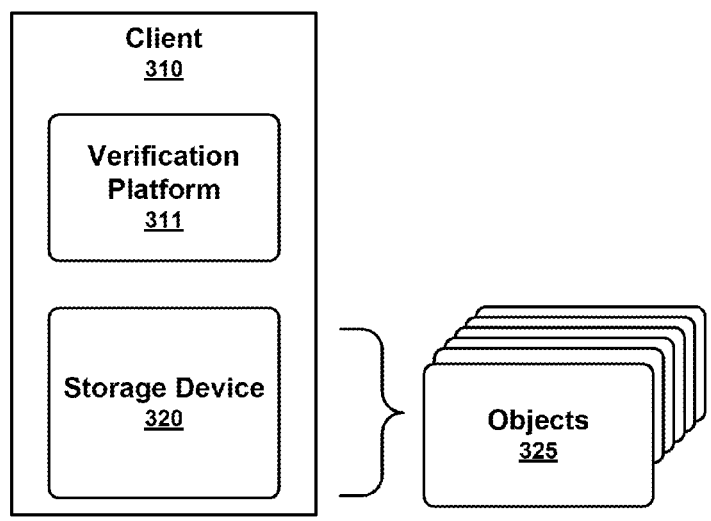
FIG. 3 is a simple block diagram illustrating components of an exemplary system according to an embodiment of the present invention.

A user may access a verification platform in a standalone client system, client-server environment, or a networked environment. FIG. 3 is a simple block diagram illustrating components of an exemplary system 300 according to an embodiment of the present invention. As shown in FIG. 3, a system 300 may comprise a client 310 executing a verification platform 311 and having a memory storage 320. The client 310 may be any computing system that executes a verification platform 311 or otherwise facilitates access to memory storage 320, for example a personal computer. The client 310 may include a processor that performs a method in accordance with the disclosed embodiments. Such a client would be part of an overall verification system in accordance with the disclosed embodiments.

Hardware designs, instruction sets, software packages, instances of modeled components, interface definitions, and other objects 325 used by the verification platform 311 may be stored in memory storage 320. A user may access the objects 325 stored in memory storage 320 with the client 310 via the verification platform 311, where the verification platform 311 is capable of accessing memory storage 320 and displaying the objects 325 and the data associated with the verification. The verification platform 311 may include a user interface, for example a program, application or middleware that acts as a frontend to and facilitates access to objects in memory storage 320. The verification platform 311 may facilitate verification of the components in a hardware design using the display and edit tools and procedures described herein. The user may interact with the verification platform 311 through a number of input devices, such as by inputting a selection as with a mouse or inputting a request as with a keyboard. The user may observe the verification results on an output device or display. The verification platform 311 may run in an application window controlled by the user.

Memory storage may include a file system, hard drive, database, or any other method of storing data. According to an embodiment, multiple memory storage devices may be implemented (not shown). For example, design storage may contain the hardware design and related information and a separate verification database may contain interface definitions and other objects used to run verification tests on a hardware design.

As shown in FIG. 3, a client 310 may be a stand-alone system, as may be of particular interest where the design being verified is confidential. Additionally, according to an aspect of an embodiment as shown in FIG. 4, a client 410 may be part of a networked environment.

Figure 4:
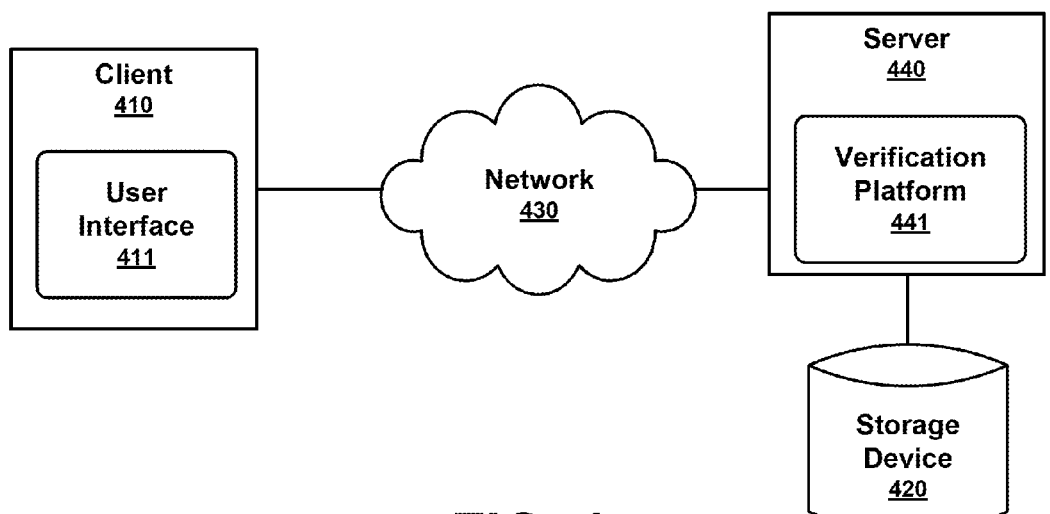
FIG. 4 is a simple block diagram illustrating components of an exemplary system according to an embodiment of the present invention.

FIG. 4 is a simple block diagram illustrating components of an exemplary system 400 according to an embodiment of the present invention. As shown in FIG. 4, system 400 may include a client 410 having a user interface 411. The client 410 may be connected to a server 440 via a network 430. The verification platform 441, which in this embodiment is located at server 440, may have access to storage device 420 storing hardware designs, instruction sets, software packages, instances of modeled components, interface definitions, and other objects utilized by the verification platform 441. The server 440 may include a processor that performs a method in accordance with the disclosed embodiments. Such a server then would be part of an overall verification system in accordance with the disclosed embodiments.

A user may access a verification platform 441 at the server 440 via the client 410 having a user interface 411 capable of accessing and displaying the components implemented as part of a hardware design and the results of the verification of those components. The client 410 may be any computing system that facilitates the user accessing storage device 420, for example a personal computer. The network 430 may be a wired or wireless network that may include a local area network (LAN), a wireless network, the Internet, or any other network available for accessing storage device 420 from the client 410.

The server 440 may be a network server accessible to the client 410 via the network 430 that may manage access to storage device 420. The user interface 411 may receive instructions regarding verification of a design from the user and utilizing the objects stored in memory storage 420, facilitate a display of the verification or the information gathered during the verification. Multiple different clients (not shown) may access storage device 420 via the network 430 and request access to the objects stored therein.

In another networked environment, the verification platform may be executed on a network capable client and access the designs, packages and other objects stored in one or more storage devices via a network and communications server.

Figure 5:
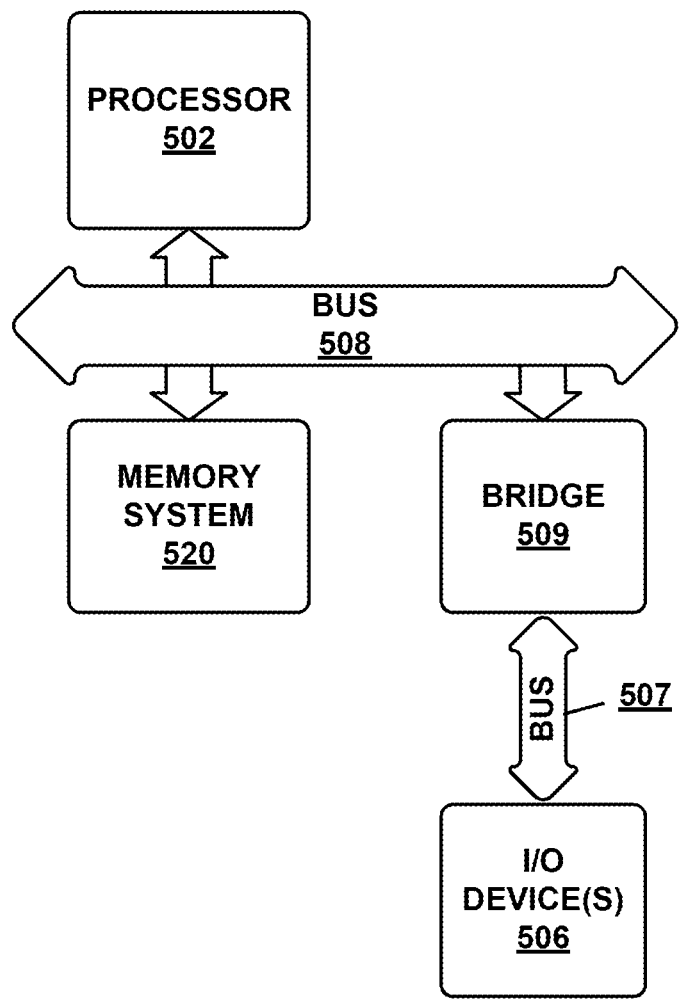
FIG. 5 is a simple block diagram illustrating components of an exemplary client according to an embodiment of the present invention.

FIG. 5 is a simple block diagram illustrating components of an exemplary client 510 according to an embodiment of the present invention. As shown in FIG. 5, the client 510 configured to execute the verification platform as described herein may include a processor 502, a memory system 520 and one or more input/output (I/O) devices 506 in communication. The communication can be implemented in a variety of ways and may include one or more computer buses 507, 508 and/or bridge devices 509 as shown in FIG. 5. According to an aspect of an embodiment, the I/O devices 506 can include network adapters and/or mass storage devices from which the client 510 can receive commands for executing the phases of verification.

As shown in FIG. 3, a client 510 may be a stand-alone system, as may be of particular interest where the components being simulated are confidential. Additionally, according to an aspect of an embodiment as shown in FIG. 4, a client 510 may be part of a networked environment.

Figure 6:
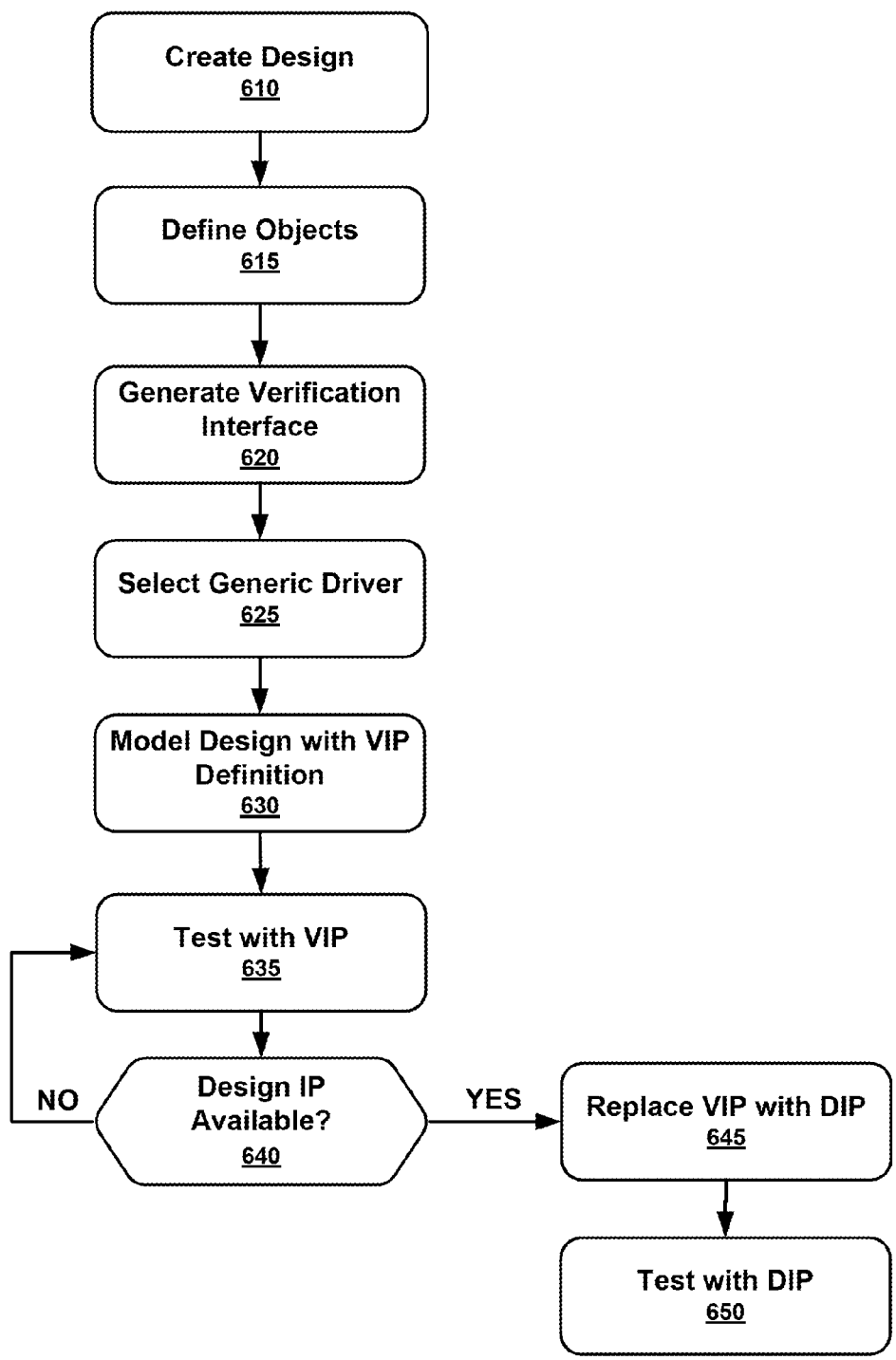
FIG. 6 illustrates an exemplary method for testing a hardware design according to an embodiment of the present invention.

FIG. 6 illustrates an exemplary method for utilizing a verification driver to test a hardware design according to an embodiment of the present invention. In FIG. 6, a hardware device is designed (block 610). During the design process, or after the design has been completed, components of the design are expressed as objects according to an object-oriented definition of one or more specified standards implemented by the design (block 615). Using the object-oriented definition of the design, a verification interface may be generated (block 620). Then a driver is selected based on the operating system or application executed on the system implementing the design and the protocols being utilized by the design (block 625). In some embodiments, an appropriate driver interface and driver stack may be generated as required.

Once the verification interface is derived and a generic driver selected, the design may be modeled with the object-oriented definition of the design (block 630). The system may then be tested with the model using a set of testcases and verification codes (block 635). Once the design IP is available (block 640), the model may be replaced by the design IP and a new interface to the design IP created or an existing interface adjusted (block 645). Then the same testcases and verification codes may be executed for the design IP (block 650).

Almost invariably, a verification process fails to run properly the first time, as there are errors. In the context of a standard to be implemented, the expected outputs from the design being modeled or tested will be known from the standard. If there are bugs, then the outputs of the verification will not be the expected outputs. These discrepancies may be identified by a review of the data recorded during the tests or other known debug process.

In the case of design IP that is designed to provide particular functionality, but in accordance with a proprietary design or feature set rather than a standard, outputs of the design will be a proprietary function of the inputs. A design IP provider may be able to provide a custom protocol consisting of design-based sets of inputs and corresponding outputs, making it possible to exercise the design through a selection of various combinations of inputs without revealing proprietary aspects of the design IP design component. An object-oriented definition of the design IP component may then be created based on the custom protocol.

In accordance with one aspect of the invention, an EDA manufacturer may receive custom protocols and make them part of appropriate EDA software, be it verification IP, a test bench, or some other EDA software. In some instances, the EDA manufacturer may be able to generate and/or implement the custom protocol on its own. For example, the custom protocol may be derived or abstracted from a public data sheet for the design IP. In general, in accordance with an aspect of the invention, custom protocols for third party IP can be generated without revealing the design IP provider's proprietary information. Because the EDA software user will not have direct access to the custom protocols provided in the design IP, the user is not privy to the design IP provider's proprietary information.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, it is noted that the arrangement of the blocks in FIG. 6 does not necessarily imply a particular order or sequence of events, nor are they intended to exclude other possibilities. For example, the operations depicted at blocks 610, 615, 620, and 630 may occur in an alternate order or substantially simultaneously with each other. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

We claim:

1. A computer-implemented method of testing a hardware design, the method comprising:
   creating, with a processor, a model of a third party IP component that is part of the design, the model incorporating verification knowledge developed during design and verification phases of the hardware design;
   generating a driver for an interface of the model, the driver generated to be compatible with a specific instance of the model and to operate the interface according to a protocol defined in the verification knowledge; and
   testing the hardware design including the IP component with the generated driver and the model, the testing comprising providing inputs and modeling corresponding outputs and comparing the modeled outputs to expected outputs for the model, such that said testing facilitates manufacture of an integrated circuit incorporating the hardware design.

2. The method of claim 1, further comprising:
   replacing the model with a hardware implementation of the design.

3. The method of claim 2, further comprising:
   testing the hardware implementation with the generated driver, the testing comprising providing inputs and generating corresponding outputs and comparing the generated outputs to expected outputs for the hardware.

4. The method of claim 1, wherein the inputs and expected outputs are consistent with the protocol.

5. The method of claim 1, wherein the inputs and expected outputs are provided by a third party.

6. The method of claim 5, wherein the inputs and expected outputs are proprietary.

7. The method of claim 1, further comprising:
   testing a software application designed to operate on the hardware design with the generated driver.

8. The method of claim 1, further comprising:
   generating a driver for every protocol implemented in the IP component.

9. The method of claim 1, further comprising:
   generating a driver for every testcase to be tested with the IP component.

10. The method of claim 9, wherein the testcases include a testcase for each of a plurality of different operating systems.

11. A non-transitory computer readable medium storing instructions that when executed by a processor perform a method of testing a hardware design, the method comprising:
   creating, with a processor, a model of a third party IP component that is part of the design, the model incorporating verification knowledge developed during design and verification phases of the hardware design;
   generating a driver for an interface of the model, the driver generated to be compatible with a specific instance of the model and to operate the interface according to a protocol defined in the verification knowledge; and
   testing the hardware design including the IP component by testing a protocol implemented in the IP component with the generated driver and the model, the testing comprising providing inputs and modeling corresponding outputs and comparing the modeled outputs to expected outputs for the model, such that said testing facilitates manufacture of an integrated circuit incorporating the hardware design.

12. The computer readable medium of claim 11, further comprising:
   replacing the model with the IP component hardware.

13. The computer readable medium of claim 12, further comprising:
   testing an implementation of the hardware design with the generated driver, the testing comprising providing inputs and generating corresponding outputs and comparing the generated outputs to expected outputs for the hardware.

14. The computer readable medium of claim 11, further comprising:
   testing a software application designed to operate on the hardware design with the generated driver.

15. A system comprising:
   a memory to store an integrated circuit design; and
   a processor configured to test the design by:
      creating a model of a third party IP component that is part of the design, the model incorporating verification knowledge developed during design and verification phases of the hardware design, generating a driver for an interface of the model, the driver generated to be compatible with a specific instance of the model and to operate the interface according to a protocol defined in the verification knowledge, and testing the hardware design including the IP component by testing a protocol implemented in the IP component with the generated driver and the model, the testing comprising providing inputs and modeling corresponding outputs and comparing the modeled outputs to expected outputs for the model, such that said testing facilitates manufacture of an integrated circuit incorporating the hardware design.

16. The system of claim 15, wherein the processor is further configured to replace the model with the IP component hardware.

17. The system of claim 15, wherein the processor is further configured to test a hardware implementation of the integrated circuit design with the generated driver, the testing comprising providing inputs and generating corresponding outputs and comparing the generated outputs to expected outputs for the hardware.

18. The system of claim 15, wherein the processor is further configured to test a software application designed to operate on the hardware design with the generated driver.

* * * * *